United States Patent [19]

Kelsoe

[11] Patent Number: 4,581,243

[45] Date of Patent: Apr. 8, 1986

[54] WOOD TREATING METHOD AND APPARATUS

[75] Inventor: Darrell W. Kelsoe, Semmes, Ala.

[73] Assignee: Permawood Treating Co., Kingwood, Tex.

[21] Appl. No.: 673,025

[22] Filed: Nov. 19, 1984

[51] Int. Cl.[4] ........................ B05D 1/18; B05C 11/00; C23C 14/00

[52] U.S. Cl. .......................................... 427/8; 118/50; 118/429; 118/712; 427/297; 427/440

[58] Field of Search ......................... 118/50, 429, 712; 427/297, 298, 440, 8

[56] References Cited

U.S. PATENT DOCUMENTS

| | | | |
|---|---|---|---|
| 4,303,705 | 12/1981 | Kelso | 427/440 X |
| 4,337,720 | 7/1982 | Hager | 118/50 |
| 4,433,031 | 2/1984 | Allen | 427/297 X |
| 4,466,998 | 8/1984 | McIntyre et al. | 427/297 |

*Primary Examiner*—Michael R. Lusignan
*Attorney, Agent, or Firm*—Larson and Taylor

[57] ABSTRACT

A self-contained, portable wood treating apparatus and method for treating wood is disclosed. The wood treating apparatus includes a generally flat base in which a water tank is contained. A cylindrical pressure vessel is located above the base. A pair of elongate work tanks are located on respective sides of the pressure vessel between the pressure vessel and base. A reagent tank is also provided adjacent the base in which a concentrated treatment liquid is contained. A treatment system is provided for treating the wood located in the pressure vessel with a dilute treatment liquid contained in the work tanks. The treatment system includes a make up system for making up additional dilute treatment liquid by mixing water from the water tank and concentrated treatment liquid from the reagent tank. The improved method of operation includes the forming of dilute treatment liquid which is pumped into the pressure vessel to pressurize the pressure vessel and wood therein. This method also includes the steps of: pumping a diluent to the pressure vessel to pressurize the pressure vessel where the pumped flow rate of the diluent decreases as the pressure increases in the pressure vessel, measuring the flow rate of the pumped diluent, and adding concentrated reagent to the diluent being pumped in a varying proportional amount corresponding to the measured flow rate to form the proper concentration of dilute treating liquid in the pressure vessel.

21 Claims, 5 Drawing Figures

PRIOR ART PLANT

WOOD TREATING METHOD AND APPARATUS

FIELD OF THE INVENTION

The present invention relates generally to the impregnation of wood with a treating agent, more particularly to a self-contained, portable wood treating apparatus and improved method for treating wood.

BACKGROUND OF THE INVENTION

In a conventional treatment plant for treatment of wood or lumber with a treating agent such as chromated copper arsenate (CCA), a large pressure vessel is used which is filled with an appropriate dilute treatment liquid. Where two concentrations of dilute treatment liquid are selectively used, two separate tanks are provided with each tank containing one concentration of the liquid. For example, with CCA, typically a 1 percent solution or a 1.4 percent solution (0.25 or 0.40 pounds per cubic foot CCA) are contained in respective tanks. To make up additional solution for each tank, a concentrated tank of CCA (usually commercially available 50 percent CCA) is fluidly connected to each tank. In addition, a water tank is also fluidly connected to each tank. Appropriate amounts of CCA concentrate and water are then pumped to the respective tanks as needed.

The method of operation of a conventional wood treatment plant is as follows. Initially, the wood to be treated is placed in the pressure vessel and the pressure vessel is sealed. A vacuum is then drawn on the pressure vessel to draw the air out of the wood. Next, depending on which concentration of dilute treatment liquid is desired to treat the wood, one of the solution tanks is connected to a pump which pumps that solution into the pressure vessel. The pump is utilized to raise the pressure in the pressure vessel to a predetermined value. As the wood goes from a vacuum to a pressure environment, the spaces from which the air was initially drawn by the vacuum are filled with the treatment liquid. After sufficient pressurizing, the remaining treatment liquid not absorbed by the wood is conducted back to the appropriate work tank from which it came.

Conventional plants of this type are made relatively large, typically 50'×100', and for economical reasons must be constructed in situ. In addition, as explained above, two separate work tanks are needed and these usually have a fairly large volume sufficient to fill the pressure vessel loaded with wood for a number of cycles of operation. Therefore, because of the size of the conventional plant, these plants are located in the southern portion of the United States adjacent the primary source of treating wood, pine trees. From these plants, the treated wood is transported all over the country. Unfortunately, treated wood weighs almost 50 percent more than untreated wood. Therefore, the shipping costs of treated wood are significantly higher than that for untreated wood. In addition, the size of the conventional plant and the output necessary to make the plant economical are too large for a location in a northern area where untreated wood could economically be shipped and thereafter the heavier treated wood economically distributed to a local market.

Therefore, there has existed in the prior art a necessity for a smaller wood treating plant which could make use of economically shipped untreated wood to a designated local market and which could then economically distribute treated wood to the designated local market.

SUMMARY OF THE INVENTION

In accordance with the present invention, a self-contained, portable wood treating apparatus and an improved method for treating wood are provided. The wood treating apparatus is cyclically operated and includes a generally flat, horizontally disposed elongate base is which a water tank is contained. A cylindrical pressure vessel is located above the base and attached thereto. This pressure vessel includes a gasketed door at one end by which wood to be treated in charged into the pressure vessel and by which treated wood is subsequently removed from the pressure vessel after treatment. A pair of elongate work tanks from which a dilute treatment liquid is transferred to the pressure vessel and to which unabsorbed dilute treatment liquid is subsequently returned are located on respective sides of the pressure vessel between the pressure vessel and the base. The work tanks includes a liquid interconnection therebetween. A reagent tank is also located adjacent the base and contains a concentrated treatment liquid. A treating means for treating the wood located in the vessel with the liquid contained in the work tank is also provided. The treating means includes a make up means for making up additional dilute treatment liquid for the dilute treatment liquid absorbed by the wood in a previous cycle by mixing water from the water tank and concentrated treatment liquid from the reagent tank.

In a preferred embodiment of the present invention, the wood treating apparatus also includes a housing located at the other end of the pressure vessel above the base in which the reagent tank and treating means are located. Preferably, the treating means includes a vacuum pump means for evacuating the pressure vessel and a pressure pump means for pressurizing the pressure vessel with dilute treatment liquid.

In the preferred embodiment, the pressure pump pressurizes the pressure vessel with dilute treatment liquid provided by the make up means. The make up means includes a water connection means for connecting the water tank to the pressure pump means and a flow measuring means for measuring the flow of liquid through the pressure pump means. A reagent connection means is then provided for connecting the reagent tank to the pumped water. Finally, a proportion means is provided for adding concentrated treatment liquid to the pumped water connection means via the reagent connection means in proportion to the flow of liquid measured by the flow measuring means. In this manner, the proper concentration of dilute treatment liquid is pressurized in the pressure vessel by the pressure pump means.

In order to stop the pumping of the pressure pump means after sufficient pressurizing of the pressure vessel, a stopping means is provided. Preferably, the stopping means stops the pressure pump when the flow rate measured by the flow measuring means reaches a predetermined minimum. In addition, the stopping means also stops the pumping of the pressure pump means when a predetermined volume of water has been pumped as measured by the flow measuring means. This predetermined volume of water is that necessary to pressurize the pressure vessel to the desired pressure.

Where two different concentrations of dilute treatment liquid are used selectively to treat the wood, a control means is further provided for selecting the concentration of treatment liquid to be used. The control means further controls the proportion means so that the proportion means adds the corresponding amount of reagent to the water to produce the desired treatment liquid concentration in the pressure vessel. Where small volumes of wood are treated compared to the size of the vessel, an auxiliary work tank can also be provided as necessary to supplement the pair of work tanks.

An elongate loading platform is also provided adjacent the one end of the pressure vessel. A stage on which the wood to be treated is mounted is movable on the loading platform into and out of the pressure vessel. According to the preferred embodiment, the loading platform has an upper surface which is shaped to receive a lower surface of the base. In this manner, the wood treatment apparatus is easily transported as a unit with the base on top of the loading platform and the stage located inside of the pressure vessel.

In the improved method for treating wood of the present invention, the make up means is used to form a dilute treating liquid which is pumped into the pressure vessel to pressurize the pressure vessel. Preferably, the reagent is chromated copper arsenate and a metered pumping of the proportional amount of reagent into the stream of the water is provided.

It is a feature of the present invention that only a single work tank containing in a single dilute concentration of treating liquid is needed to allow for various dilute concentrations of treating liquid to be absorbed by the treated wood.

It is a further feature of the present invention that a self-contained, portable wood treating apparatus is provided which can be economically built at a centralized plant and shipped to various locations with ease.

It is an object of the present invention to provide a portable wood treating apparatus which is relatively small in scale such that the apparatus can be located in a designated area of use to benefit from the reduced shipping costs of treated wood to the designated area.

Other features, objects, and advantages of the present invention are stated in or apparent from a detailed description of a present preferred embodiment of the invention found hereinbelow.

DETAILED DESCRIPTION OF THE PREFERRED EMBODIMENT

Figure 1:
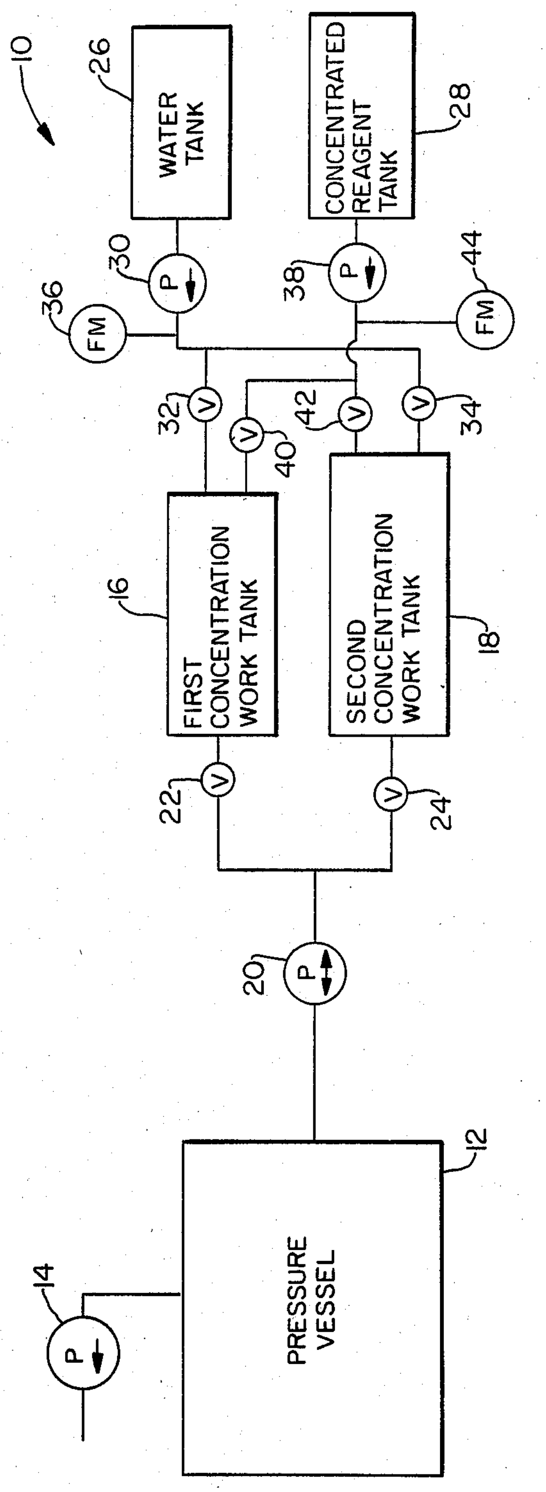
FIG. 1 is a schematic representation of a conventional wood treatment plant.

With reference now to the drawings in which like numerals represent like elements throughout the several views, a conventional, prior art wood treatment apparatus 10 is depicted schematically in FIG. 1. Wood treatment apparatus 10 includes a pressure vessel 12 which can be suitably evacuated using an evacuation pump 14.

Wood treatment apparatus 10 also includes a first concentration work tank 16 and a second concentration work tank 18. Typically, where the treating reagent is chromated copper arsenate, the first concentration work tank contains a 1 percent dilute concentration of CCA while the second concentration work tank has a 1.4 percent concentration of CCA. Both work tanks 16 and 18 are fluidly connected to pressure vessel 12 through a reversible pressure pump 20. Valves 22 and 24 are provided in the lines leading from respective work tanks 16 and 18 to pressure pump 20 to select which solution will be pumped into pressure vessel 12.

In order to make up additional treatment liquid in work tanks 16 or 18, a water tank 26 and a concentrated reagent tank 28 are provided. As shown, water tank 26 is connected to work tanks 16 and 18 so that a pump 30 can pump water from water tank 26 through normally closed valves 32 and 34 into appropriate work tanks 16 or 18. A flow meter 36 monitors the amount of water pumped into the respective tank. In a similar manner, a pump 38 pumps concentrated reagent from reagent tank 28 to respective work tanks 16 and 18 through a respective valve 40 or 42. A flow meter 44 is also provided to monitor the volume of reagent pumped into respective work tanks 16 or 18.

The operation of prior art wood treatment apparatus 10 is as follows. Initially, after the wood to be treated is charged into pressure vessel 12, pressure vessel 12 is evacuated using evacuation pump 14. Next, the dilute concentration of treatment solution to be applied to the wood is selected, either the dilute concentration in work tank 16 or the dilute concentration of work tank 18. After this selection is made, the appropriate valve 22 or 24 is opened and pump 20 is operated to pump the liquid from appropriate work tank 16 or 18 into pressure vessel 12. Pressure pump 20 continues operation until enough liquid is pumped from work tank 16 or 18 into pressure vessel 12 to pressurize pressure vessel 12 to the desired pressure. Subsequently, pressure pump 20 is actuated to reverse the flow of treatment liquid back to the appropriate work tank 16 or 18.

When it is necessary to make up additional treatment liquid in work tank 16 or 18, water from water tank 26 is pumped into the appropriate work tank 16 or 18 through valve 32 or 34. At this time, the volume of water pumped is monitored by flow meter 36. Subsequently, it can be determined how much concentrated reagent should be pumped into the appropriate work tanks 16 or 18 to match the amount of water pumped therein. When this is determined, pump 38 is actuated to pump the appropriate amount of concentrated reagent from reagent tank 28 into the appropriate work tank 16 or 18 through valve 40 or 42. Flow meter 44 is monitored to stop pump 38 when the appropriate amount of reagent has been pumped.

It should be appreciated that wood treatment apparatus 10 represents a relatively large plant and that work tank 16 and 18 are also relatively large and contain sufficient volume to operate a number of cycles without taking up additional treatment liquid. It should also be appreciated that additional work tanks may be provided where more than two treatment liquid concentrations are selectively used.

Figure 2:
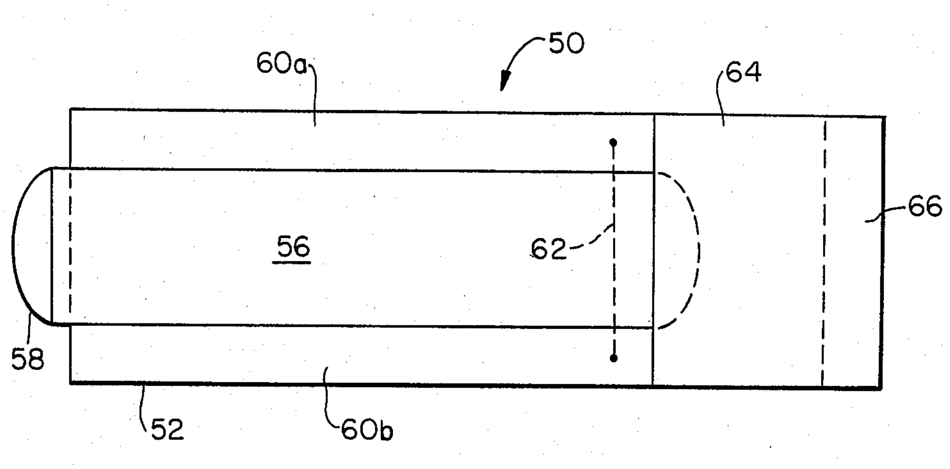
FIG. 2 is a diagramatic top plan view of a wood treatment apparatus according to the present invention.
Figure 3:
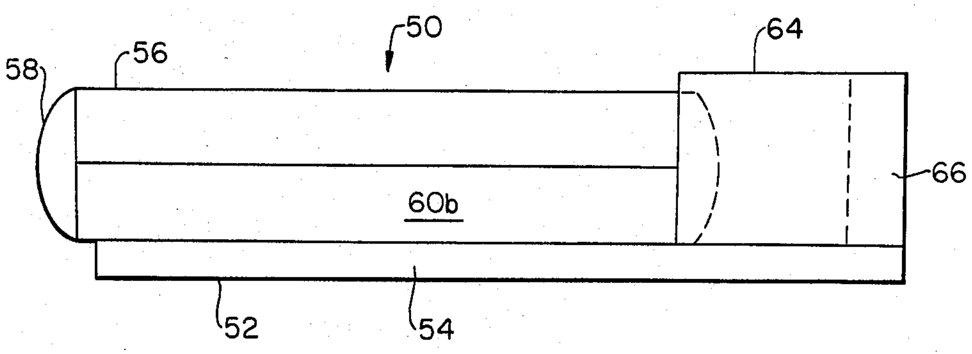
FIG. 3 is a diagramatic side elevation view of the wood treatment apparatus depicted in FIG. 2.
Figure 4:
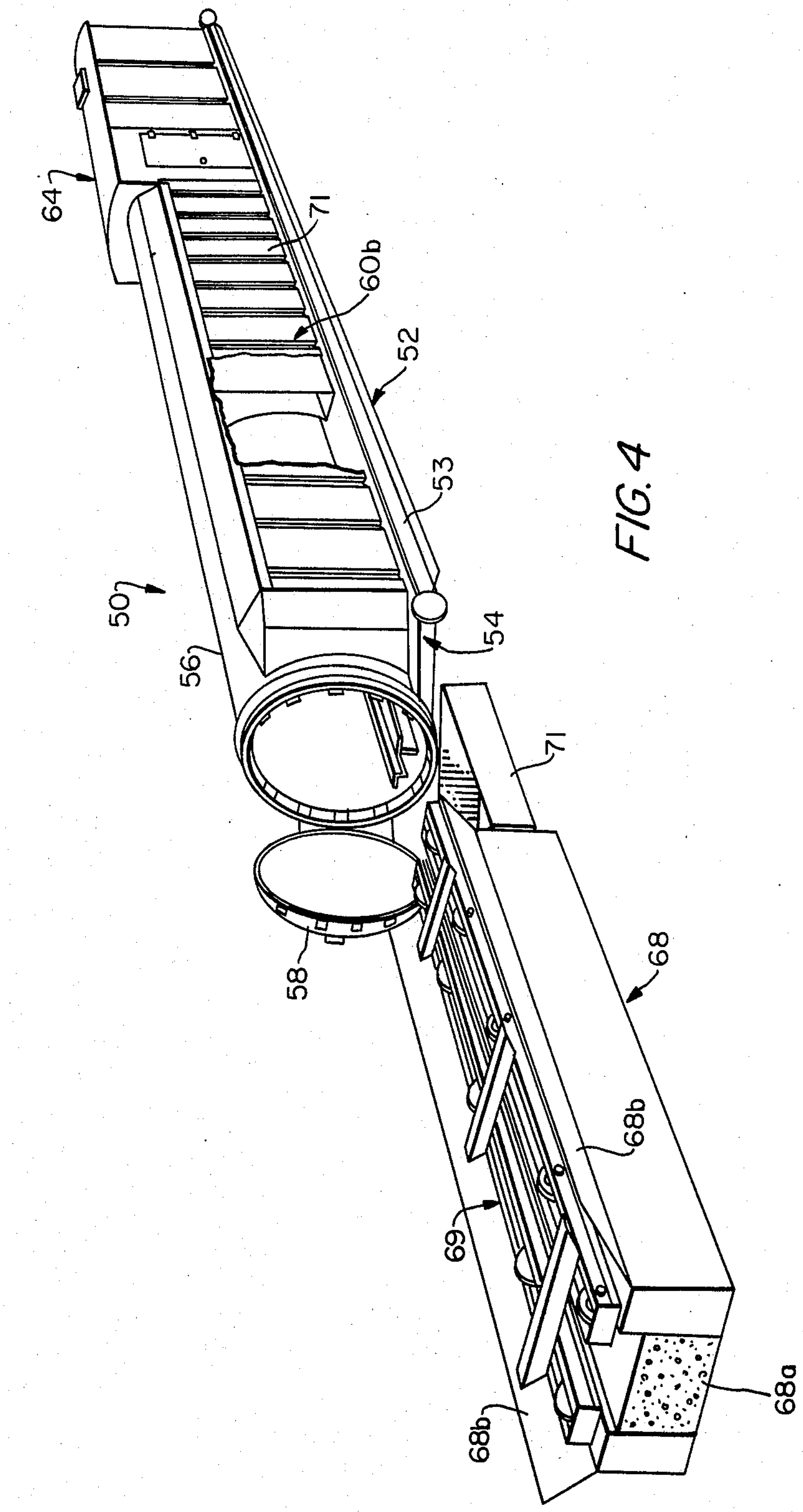
FIG. 4 is a side perspective view of the wood treatment apparatus depicted in FIGS. 2 and 3.

Depicted diagramatically in FIGS. 2, 3 and 4 is a self-contained, portable wood treating apparatus 50 according to the present invention. Wood treating apparatus 50 includes a base 52 in which a water tank 54 is contained. Water tank 54 is connected to a suitable source of tap water or the like. Base 52 includes side I beams 53 along the length thereof for support. Mounted above base 52 is a cylindrical pressure vessel 56 having a gasketed door 58 at one end. Mounted on either side of pressure vessel 56 above base 52 are work tanks 60*a* and 60*b*. An outer shell 61 is provided about work tanks 60*a* and 60*b* to double insulate work tanks 60*a* and 60*b*. Work tanks 60*a* and 60*b* are fluidly interconnected by an interconnection 62 depicted schematically. At the end of pressure vessel 56 opposite door 58, a housing 64 is provided. Located inside of housing 64 is a reagent tank 66 in which the concentrated reagent is contained. Housing 64 also includes the various pumps and valved connections which are described subsequently.

Also depicted in FIG. 4 is a loading platform 68 which is located adjacent door 58. A stage 69 is provided on platform 68. Stage 69 is movable into and out of pressure vessel 56 with wood thereon. A liquid trap 71 is provided between door 58 and loading platform 68 to catch any liquid dropping from stage 69 or from inside of pressure vessel 56 through door 58. It should be appreciated that loading platform 68 is approximately the same length as pressure vessel 56 and that the center of loading platform 68 is filled with concrete 68*a* after loading platform 68 is put in place. Prior to the pouring of concrete 68*a*, the upper surface of the loading platform 68 including flanges 68*b* forms a receiver for the lower surface of base 52 including I beams 53. In this manner, wood treating apparatus 50 is easily transported as a unit on a flat bed truck with base 52 (including pressure vessel 56 with stage 69 inside) located on and held in place with loading platform 68. After installation, if it is desired to again move wood treating apparatus 50, concrete 68*a* is broken out loading platform 68 before moving.

Figure 5:
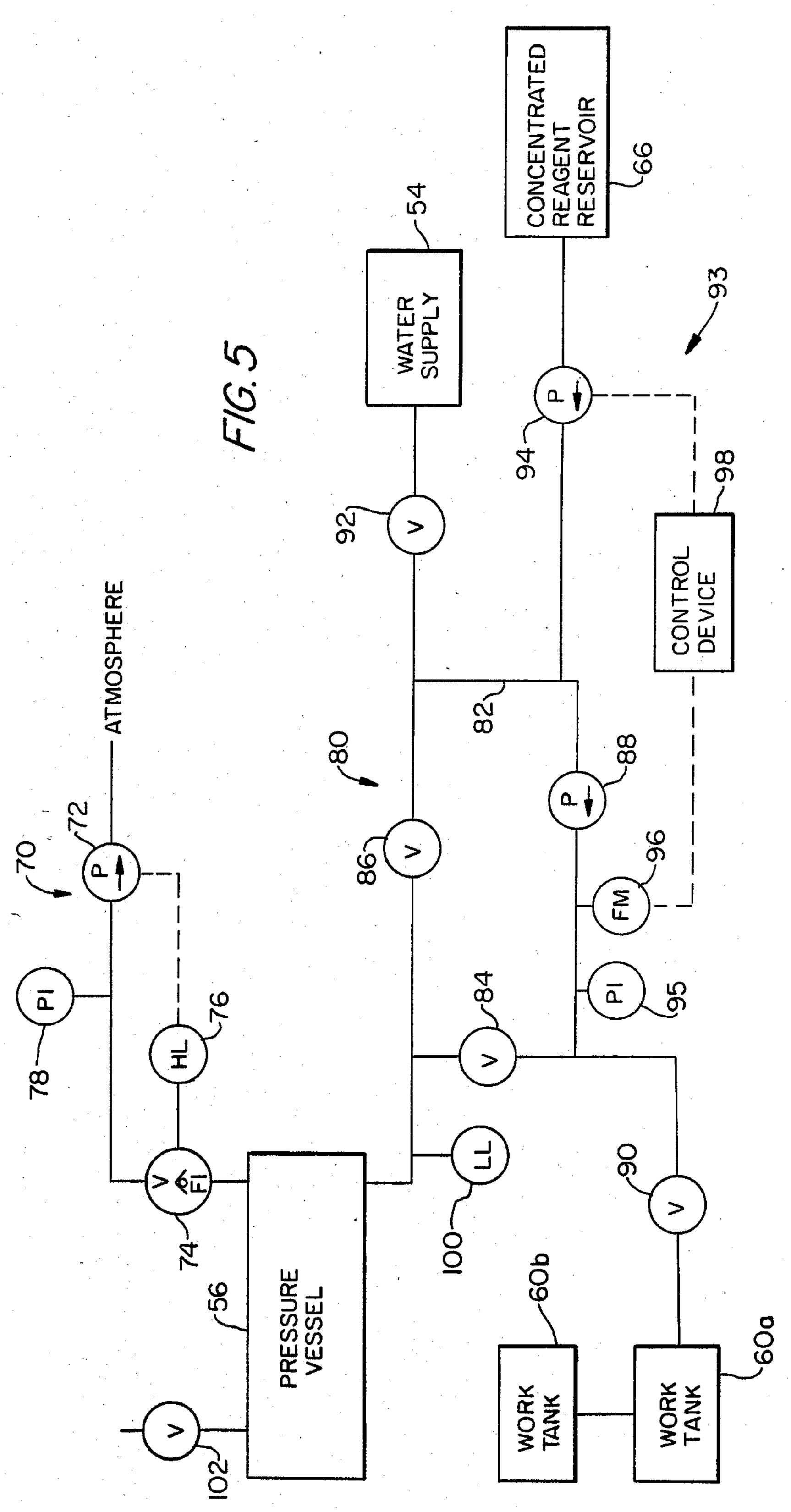
FIG. 5 is a schematic representation of the wood treatment apparatus of the present invention.

Depicted schematically in FIG. 5 are the various valved connections and pump means used with the elements of wood treating apparatus 50 described above. In particular, it can be seen that wood treating apparatus 50 includes a vacuum pump means 70. Vacuum pump means 70 is used to evacuate pressure vessel 56 and includes a vacuum pump 72. Vacuum pump means 70 also includes a float valve 74 which prevents liquids from passing to vacuum pump 72. A high level switch 76 is also provided which senses the closing of float valve 74 and which turns vacuum pump 72 off when float valve 74 closes. The vacuum pulled on pressure vessel 56 is sensed by a pressure indicator 78.

A treating means 80 is also schematically depicted in FIG. 5. Treating means 80 includes a loop 82 containing valves 84 and 86 and a pressure pump 88. Fluidly connected to loop 82 by a valve 90 are connected work tanks 60*a* and 60*b* discussed above. Water tank 54 is also connected to loop 82 through a valve 92. Finally, reagent tank 66 is connected to loop 82 through a metered pump 94. Downstream of pressure pump 88 is a pressure indicator 95 which senses the pressure of the liquid being pumped to pressure vessel 56 and hence the pressure in pressure vessel 56. A flow measuring means 96 is also provided downstream of pump 88 to measure the flow of liquid through pump 88. The flow sensed by flow measuring means 96 is monitored by a control device 98. Control device 98 in turn controls the function of metered pump 94. In addition, control device 98 is used to control the operation of treating means 80 including valves 84, 86, 90, and 92 and to sense the condition of a low level switch 100 provided adjacent the bottom of pressure vessel 56. It should further be appreciated that control device 98 also controls the operation of vacuum pump means 70, monitors pressure indicator 95, and controls a pressure relief valve 102 for pressure vessel 56. When CCA is used, various overflow protective traps and catches for the CCA are also provided to prevent any CCA from leaking from housing 64 during the operation of wood treatment apparatus 50.

A cycle of operation of portable wood treating apparatus 50 occurs as follows. Initially, it should be appreciated that valves 84, 86, 90, 92 and 102 are closed prior to commencing a cycle of operation. After charging of the wood to be treated into pressure vessel 56 through door 58 using loading platform 68 and stage 69, control device 98 is activated. When this occurs, control device 98 actuates vacuum pump means 70. This causes vacuum pump 72 to withdraw air from pressure vessel 56. Vacuum pump 72 is operated until a vacuum of approximately 22 inches is obtained in pressure vessel 56 as indicated by pressure indicator 78. At this vacuum pressure, most of the air in the wood inside of the pressure vessel 56 is removed therefrom.

After holding the vacuum pressure for a suitable time in pressure vessel 56, control device 98 opens valves 84 and 90. This causes the liquid contained in work tanks 60*a* and 60*b* to be drawn by the vacuum pressure in pressure vessel 56 into pressure vessel 56. Vacuum pump 72 continues to operate during this time period in order to completely fill pressure vessel 56 with the liquid from work tanks 60*a* and 60*b*. When the pressure vessel 56 is filled, the liquid flows upward into float valve 74 and ultimately causes float valve 74 to close. When float valve 74 closes, high level switch 76 senses this and immediately turns off vacuum pump 72. Float valve 74 helps assure that no liquid will reach vacuum pump 72 as the liquid would damage vacuum pump 72.

After pressure vessel 56 is completely filled with liquid from work tanks 60*a* and 60*b*, control device 98 closes valve 90. Next, control device 98 opens valve 92 and actuates pump 88. This causes pump 88 to pump water from water tank 54 into pressure vessel 56 thus pressurizing pressure vessel 56. Pump 88 is actuated until pressure vessel 56 is pressurized to the desired pressure, typically 150 psi.

With the present invention, the desired pressure in pressure vessel 56 is sensed by flow measuring means 96 which measures the volume of liquid pumped into pressure vessel 56. With a known volume of wood, the number of gallons which must be pumped into pressure vessel 56 to pressurize pressure vessel 56 to a desired pressure are known so that control device 98 can turn off pressure pump 88 when the desired volume of liquid has been pumped. Alternatively, the performance of pressure pump 88 is known such that the volume pumped by pressure pump 88 decreases in proportion to the pressure in pressure vessel 56. Thus, when the volume of liquid pumped by pressure pump 88 reaches a predetermined minimum, this corresponds to the desired pressure in pressure vessel 56. Again, flow measuring means 96 senses when the volume of liquid pumped by pressure pump 88 reaches the predetermined minimum and signals control device 98 to cease operation of pressure pump 88 and to close valve 92. Pressure indicator 95 also senses the pressure in pressure vessel 56 and can be used to determine the number of gallons needed to pressurize pressure vessel 56 as well as the minimum pumped flow of pressure pump 88 indicating the desired pressure in pressure vessel 56. Pressure indicator 95 can also serve as a redundant indicator of pressure in pressure vessel 56 to turn off pump 88 when the desired pressure is reached.

In the discussion above, it has been indicated that it is water from water tank 54 which is being pumped into pressure vessel 56. While this is true, it should be appreciated that what is actually delivered to pressure vessel 56 is a combination of water from water tank 54 and concentrated reagent from reagent tank 66. This added water and reagent serves to make up additional treatment liquid for the treatment liquid which was absorbed by the wood in a previous cycle. This is accomplished by a make up means 93 which includes a metered pump 94 which pumps concentrated reagent from reagent tank 66 into the water being delivered by pressure pump 88. The amount of reagent pumped by metered pump 94 is controlled by control device 98 to vary proportionally to the volume pumped by pressure pump 88 as monitored by flow measuring means 96.

It should be appreciated that the concentration of the treating liquid in work tank 60 is normally the desired concentration for treating the wood in pressure vessel 56. Thus, metered pump 94 merely adds the desired proportion of concentrated reagent to the water pumped from water tank 54. As mentioned above, typically these concentrations for CCA are 1.4% or 1%. However, it should also be appreciated that occasionally it would be desired to switch from one concentration to another. In order to accomplish this, the operation of make up means 93 is simply varied by control device 98. In going from a concentration of 1.4% to 1%, metered pump 94 is simply not actuated until the initial 1.4% solution in pressure vessel 56 from work tanks 60*a* and 60*b* has been diluted by the addition of water from water tank 54 to the desired 1% solution. At that time, metered pump 94 then simply adds enough reagent to the water pumped by pump 88 to maintain the 1% solution until full pressurization is reached in pressure vessel 56. On the other hand, in going from a 1% solution to 1.4% solution, metered pump 94 merely pumps additional concentrated reagent into the water being pumped by pump 88 into pressure vessel 56 until the desired concentration is reached by the liquid in pressure vessel 56. Thereafter, only sufficient concentrated reagent is added to the water being pumped to maintain the desired concentration.

After pressure vessel 56 has been suitably pressurized and pump 88 has been turned off by control device 98, pressure vessel 56 is typically left at this high pressure for a predetermined period of time. After this predetermined period of time, control device 98 opens valves 84 and 90 to allow the pressure in pressure vessel 56 to be released by the flow of liquid therein to work tanks 60*a* and 60*b*. After the pressure is released, control device 98 closes valve 84 and opens valve 86. Pump 88 is then again actuated to pump the remainder of the liquid from pressure vessel 56 back to work tanks 60*a* and 60*b*. When pressure vessel 56 is emptied of liquid, low level switch 100 senses this and control device 98 turns off pump 88 and closes valves 86 and 90.

When treating with CCA, a final vacuum is usually pulled on the impregnated wood to remove any liquid which might seep therefrom. To do this, control device again actuates vacuum pump means 70 to evacuate pressure vessel 56 to 22 inches of vacuum. After this is achieved, air is suitably bled into pressure vessel 56 by pressure relief valve 102 to return pressure vessel 56 to atmospheric pressure.

In order to empty any liquid which may have bleed out of the wood in pressure vessel 56, control device 98 again opens valves 86 and 90 and actuates pump 88 to remove any liquid from pressure vessel 56 to work tank 60. When low level switch 100 senses that pressure vessel 56 is empty of liquid, pump 88 is turned off and valves 86 and 90 are again closed. At this time, the door to pressure vessel 56 is opened and the treated wood is removed. This completes the cycle of operation of portable wood treating apparatus 50.

By way of example, it is anticipated that portable wood treating apparatus 50 would include a pressure vessel approximately six feet in diameter and 25 feet long. With such a pressure vessel, the combined tank capacity of work tanks 60*a* and 60*b* would be approximately 6,000 gallons. The capacity of reagent tank 66 would then be approximately 3,800 gallons and the capacity of water tank 54 would be approximately 900 gallons.

While the present invention has been described with respect to an exemplary embodiment thereof, it will be understood by those of ordinary skill in the art that variations and modifications can be effected within the scope and spirit of the invention.

I claim:

1. A self-contained, portable wood treating apparatus which is cyclically operated comprising:

a generally flat, horizontally disposed, and elongate base having a bottom and a longitudinal axis;

a source of water;

a cylindrical pressure vessel located above said base and attached thereto such that the longitudinal axis of said pressure vessel is parallel to the longitudinal axis of said base, said pressure vessel including a gasketed door at one end by which wood to be treated is charged into said pressure vessel and by which treated wood is subsequently removed from said pressure vessel;

an elongate work tank from which a dilute treatment liquid is transferred to said pressure vessel and to which unabsorbed dilute treatment liquid is subsequently returned, said work tank being located adjacent said pressure vessel and above the bottom of said base;

a reagent tank located adjacent said base in which a concentrated treatment liquid is contained; and a treating means for treating wood located in said pressure vessel with the liquid contained in said work tank, said treating means including a make up means for making up additional dilute treatment liquid to compensate for the dilute treatment liquid absorbed by the wood in a previous cycle by mixing water from said water source and concentrated treatment liquid from said reagent tank, said treating means further including a vacuum pump means for evacuating said pressure vessel and a pressure pump means for pressurizing said pressure vessel with dilute treatment liquid from said make up means; and wherein said make up means includes a water connection means for connecting said source of water to said pressure pump means, a flow measuring means for measuring the flow of liquid pumped by said pressure pump means, a reagent connection means for connecting said reagent tank to the liquid pumped by said pressure pump means, and a proportion means for adding concentrated treatment liquid to the liquid pumped by said pressure pump means via said reagent connection means in proportion to the flow of liquid measured by said flow measuring means such that the proper concentration of dilute treatment liquid is pressurized in said pressure vessel by said pressure pump means.

2. A self-contained, portable wood treating apparatus as claimed in claim 1 wherein there are two of said elongate tanks, each said work tanks being located along a respective side of said pressure vessel and above said base, said work tanks including a liquid interconnection therebetween.

3. A self-contained, portable wood treating apparatus as claimed in claim 2 wherein said source of water is a water tank contained in said base.

4. A wood treating apparatus as claimed in claim 3 and further including a housing located at the other end of said pressure vessel and above said base, said housing enclosing said reagent tank and said treating means.

5. A wood treating apparatus as claimed in claim 3 and further including an auxiliary work tank located adjacent and to one side of said base, said auxiliary work tank being in fluid communication with said pair of work tanks.

6. A wood treatment appatatus as claimed in claim 1 and further including an elongate loading platform located adjacent the one end of said pressure vessel and a stage on which the wood to be treated is mounted and which is movable from said loading platform into said pressure vessel and back out of said pressure vessel, said loading platform having an upper surface which is shaped to receive a lower surface of said base such that said wood treatment apparatus is easily transported as a unit with said base on top of said loading platform.

7. A wood treating apparatus as claimed in claim 1 wherein said treating means further includes a stopping means for stopping the pumping of said pressure pump means when the flow rate measured by said flow measuring means reaches a predetermined minimum.

8. A wood treating apparatus as claimed in claim 7 wherein said stopping means also stops the pumping of said pressure pump when a predetermined volume of water has been pumped as measured by said flow measuring means.

9. A wood treating apparatus as claimed in claim 1 wherein at least two different concentrations of dilute treatment liquid are used selectively to treat the wood; and further including a control means for selecting the concentration of treatment liquid to be used and for controlling said proportion means such that said proportion means adds the corresponding amount of reagent to the water to produce the desired treatment liquid concentration in said pressure vessel.

10. A wood treating apparatus as claimed in claim 3 wherein said water tank, said work tanks, and said reagent tank each include a spaced shell thereabout such that all of said tanks are double insulated.

11. In an improved method for treating wood by impregnation with a dilute treatment liquid of the type comprising the steps of loading the wood into a pressure vessel, evacuating the pressure vessel, filling the pressure vessel with the dilute treatment liquid which is contained in an adjacent work tank, and pressurizing the pressure vessel by pumping in additional dilute treatment liquid in order to impregnate the wood; the improvement comprising the steps of:

forming the dilute treatment liquid which is pumped into the pressure vessel to pressurize the pressure vessel by:

(a) pumping a diluent to the pressure vessel to pressurize the pressure vessel, the pumped flow rate of diluent decreasing as the pressure increases in the pressure vessel;

(b) measuring the flow rate of the pumped diluent; and (c) adding concentrated reagent to the diluent being pumped in a varying proportionate amount corresponding to the measured flow rate to form the proper concentration of dilute treatment liquid.

12. An improved method for treating wood as claimed in claim 11 wherein the diluent is tap water and the reagent is chromated copper arsenate.

13. An improved method for treating wood as claimed in claim 11 wherein the adding of the reagent includes the metered pumping of the proportionate amount of the reagent into the stream of the diluent.

14. An improved method for treating wood as claimed in claim 11 and further including the stopping of the pumping of diluent when the flow rate reaches a predetermined minimum.

15. An improved method for treating wood as claimed in claim 14 wherein the stopping of the pumping of the diluent is additionally stopped after a predetermined volume of diluent is pumped.

16. An improved method for treating wood as claimed in claim 11 wherein at least two different concentrations of dilute treatment liquid are used selectively to treat the wood; and further including the steps of: selecting which concentration is to be used, and adding concentrated reagent to the diluent being pumped only in the amount necessary to produce the desired treatment liquid concentration in the pressure vessel.

17. A portable wood treating apparatus which is cyclically operated comprising:

a cylindrical pressure vessel including a gasketed door at one end by which wood to be treated is charged into said pressure vessel and by which treated wood is subsequently removed from said pressure vessel;

a water tank located adjacent said pressure vessel;

a work tank located adjacent said pressure vessel from which a dilute treatment liquid is transferred to said pressure vessel and to which unabsorbed dilute treatment liquid is subsequently returned;

a reagent tank located adjacent said pressure vessel in which a concentrated treatment liquid is contained; and a treating means for treating wood located in said pressure vessel with the dilute treatment liquid contained in said work tank, said treating means including (a) a vacuum pump means for evacuating said charged pressure vessel;

(b) a pressure pump means for pressurizing said charged pressure vessel with dilute treatment liquid; and (c) a make up means for making up additional dilute treatment liquid for the dilute treatment liquid absorbed by the wood in a previous cycle, said make up means including a water connection means for connecting said water tank to said pressure pump means, a flow measuring means for measuring the flow of water through said pressure pump means, a reagent connection means for connecting said reagent tank to the water pumped by said pressure pump means, and a proportion means for adding concentrated treatment liquid to the water pumped by said pressure pump means via said reagent connection means in proportion to the flow of water measured by said flow measuring means such that the proper concentration of dilute treatment liquid is pressurized in said pressure vessel by said pressure pump means.

18. A portable wood treating apparatus as claimed in claim 17 wherein at least two different concentrations of dilute treatment liquid as used selectively to treat the charge of wood; and further including a control means for selecting the concentration of treatment liquid to be used such that said proportion means adds the corresponding amount of reagent to the water to produce the desired treatment liquid concentration in said pressure vessel.

19. A portable wood treating apparatus as claimed in claim 18 wherein said treating means further includes a stopping means for stopping the pumping of said pressure pump means when the flow rate measured by said flow measuring means reaches a predetermined minimum or when a predetermined volume of water has been pumped as measured by said flow measuring means.

20. A self-contained, portable wood treating apparatus which is cyclically operated comprising:

a generally flat, horizontaly disposed, and elongate base having a longitudinal axis;

a water tank contained in said base;

a cylindrical pressure vessel located above said base and attached thereto such that the longitudinal axis of said pressure vessel is parallel to the longitudinal axis of said base, said pressure vessel including a gasketed door at one end by which wood to be treated is charged into said pressure vessel and by which treated wood is subsequently removed from said pressure vessel;

a pair of elongate work tanks from which a dilute treatment liquid is transferred to said pressure vessel and to which unabsorbed dilute treatment liquid is subsequently returned, each said work tank being located along a respective side of said pressure vessel and above said base, said work tanks including a liquid interconnection therebetween;

a housing located at the other end of said pressure vessel and above said base;

a reagent tank located in said housing in which a concentrated treatment liquid is contained; and a treating means for treating wood located in said pressure vessel with the liquid contained in said work tanks, said treating means being located in said housing and including (a) a vacuum pump means for evacuating said pressure vessel, (b) a pressure pump means for pressurizing said pressure vessel with dilute treatment liquid, and (c) a make up means for making up additional dilute treatment liquid for the dilute treatment liquid absorbed by the wood in a previous cycle by mixing water from said water tank and concentrated treatment liquid from said reagent tank, said make up means causing dilute liquid treatment liquid to be pumped by said pressure pump means and including (i) a water connection means for connecting said water tank to said pressure pump means, (ii) a flow measuring means for measuring the flow of liquid through said pressure pump means, (iii) a reagent connection means for connecting said reagent tank to the water pumped by said pressure pump means, (iv) a proportion means for adding concentrated treatment liquid to the water pumped by said pressure pump means via said reagent connection means in proportion to the flow of liquid measured by said flow measuring means such that the proper concentration of dilute treatment liquid is pressurized in said pressure vessel by said pressure pump means, (v) a stopping means for stopping the pumping of said pressure pump when the flow rate measured by said flow measuring means reaches a predetermed minimum or when a predetermined volume of water has been pumped as measured by said flow measuring means, and (vi) a control means for selecting between at least two different concentrations of dilute treatment liquid which are used selectively to treat the wood and for controlling said proportion means such that said proportion means adds the corresponding amount of reagent to the water to produce the desired treatment liquid concentration in said pressure vessel.

21. A wood treating apparatus as claimed in claim 20 and further including an elongate loading platform located adjacent the one end of said pressure vessel on which the wood to be treated is mounted and a stage which is movable from said loading platform into said pressure vessel and back out of said pressure vessel, said loading platform having an upper surface which is shaped to receive a lower surface of said base such that said wood treatment apparatus is easily transported as a unit with said base on top of said loading platform.

* * * * *